(12) United States Patent
Yoshii et al.

(10) Patent No.: US 7,699,945 B2
(45) Date of Patent: Apr. 20, 2010

(54) SUBSTRATE TREATMENT METHOD AND FILM FORMING METHOD, FILM FORMING APPARATUS, AND COMPUTER PROGRAM

(75) Inventors: Naoki Yoshii, Nirasaki (JP); Koumei Matsuzawa, Uozu (JP); Yasuhiko Kojima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/859,490

(22) Filed: Sep. 21, 2007

(65) Prior Publication Data
US 2008/0020934 A1    Jan. 24, 2008

Related U.S. Application Data

(63) Continuation-in-part of application No. PCT/JP2006/305710, filed on Mar. 22, 2006.

(30) Foreign Application Priority Data
Mar. 23, 2005    (JP)    ............... 2005-083764

(51) Int. Cl.
*C21D 1/00*    (2006.01)
*H01L 21/44*    (2006.01)
(52) U.S. Cl. .................. 148/525; 438/654; 438/686; 438/687
(58) Field of Classification Search ............... 148/95, 148/525; 438/654, 686, 687
See application file for complete search history.

(56) References Cited

U.S. PATENT DOCUMENTS

| 6,664,636 | B2 | 12/2003 | Pyo et al. | |
| 2002/0024142 | A1 | 2/2002 | Sekiguchi | |
| 2004/0089947 | A1* | 5/2004 | Iwasaki et al. | ............... 257/753 |
| 2004/0166596 | A1* | 8/2004 | Sashida et al. | ................. 438/3 |

FOREIGN PATENT DOCUMENTS

| JP | 7-176615 | A | 7/1995 |
| JP | 11-340233 | A | 12/1999 |
| JP | 2000-183064 | A | 6/2000 |
| JP | 2002-26015 | A | 1/2002 |
| JP | 2002-75995 | A | 3/2002 |
| JP | 2003-51460 | A | 2/2003 |

* cited by examiner

*Primary Examiner*—Roy King
*Assistant Examiner*—Ngoclan T Mai
(74) *Attorney, Agent, or Firm*—Oblon, Spivak, McClelland, Maier & Neustadt, L.L.P.

(57) ABSTRACT

There is provided a substrate treatment method performed on a substrate before forming a Cu film on a surface of a base material of the substrate. In the substrate treatment method, a substrate on which a Cu film is to be formed is prepared; and a specific treatment is performed on the substrate so that a crystalline orientation of the surface of the base material of the substrate has a small lattice mismatch with the Cu film.

7 Claims, 5 Drawing Sheets

SUBSTRATE TREATMENT METHOD AND FILM FORMING METHOD, FILM FORMING APPARATUS, AND COMPUTER PROGRAM

This application is a Continuation-In-Part Application of PCT International Application No. PCT/JP2006/305710 filed on Mar. 22, 2006, which designated the United States.

FIELD OF THE INVENTION

The present invention relates to a substrate treatment method, a film forming method and a film forming apparatus for forming a copper (Cu) film on a substrate, and a computer executable program to be used therein.

BACKGROUND OF THE INVENTION

With the realization of high-speed semiconductor devices miniaturization of wiring patterns, Cu is attracting attention as a wiring material, for it has higher conductivity than aluminum as well as high electromigration tolerance. As a method for forming a Cu film, there has been known a chemical vapor deposition (CVD) method of forming a Cu film on a substrate by a pyrolysis reaction of a source gas containing Cu or by a reduction reaction between the source gas containing Cu and a reducing gas. A Cu film formed by this CVD method is suitable for forming fine wiring patterns because it has high coverage as well as high infiltration in a deep and narrow pattern.

With regard to various thin film forming processes using the CVD method, there has been proposed increasing a substrate temperature as a method to improve a film forming rate (see, for example, Japanese Patent Laid-open Application No. 2002-151488 (paragraphs 0002, 0003, etc.). However, if the temperature of the substrate is set to be high when a Cu film is formed, it would result in an agglutination of the Cu film.

SUMMARY OF THE INVENTION

It is, therefore, an object of the present invention to provide a method capable of increasing a Cu film forming rate without causing an agglutination of Cu and also to provide a Cu film forming method using the substrate treatment method. Further, the present invention also provides a film forming apparatus for performing the film forming method and a computer executable program for use in controlling the film forming apparatus.

In accordance with a first aspect of the present invention, there is provided a substrate treatment method performed on a substrate before forming a Cu film on a surface of a base material of the substrate, the method including: a preparation step of preparing the substrate on which a Cu film is to be formed; and a treatment step of performing a specific treatment on the substrate to allow a crystalline orientation of the surface of the base material to have a small lattice mismatch with the Cu film.

In accordance with the present invention, prior to conducting a film forming process on the substrate, by performing the specific treatment on the substrate to allow the crystalline orientation of the surface of the base material, on which the Cu film is to be formed, to have a small lattice mismatch with the Cu, a film forming rate for forming a Cu film on the base material can be increased. Further, the adhesiveness between the Cu film and the base material can be improved.

Preferably, the treatment step is implemented by a heat treatment, a laser irradiation treatment or a plasma treatment.

Further, preferably, in the treatment step, the specific treatment is performed on the substrate such that the surface of the base material of the substrate has a crystalline orientation having a small lattice mismatch with a (111) surface of the Cu film. The (111) surface or the like is a grating surface indicated by Miller Index.

Further, preferably, the base material is one of Ru, Al, Ag, Au, Ni, Pd, Pt, Ir, Cu, Ti and Zn.

If the base material is one of Ru, Ti and Zn having a hexagonal close-packed structure, in the treatment step, preferably, the base material is one of Ru, Ti and Zn, and in the treatment step, the specific treatment is performed on the substrate such that the crystalline orientation of the surface of the base material of the substrate is made to a c-axis direction. Further, if the base material is one of Al, Ag, Au, Ni, Pd, Pt, Ir and Cu having a face-centered cubic lattice structure, in the treatment step, preferably, the base material is one of Al, Ag, Au, Ni, Pd, Pt, Ir and Cu, and in the treatment step, the specific treatment is performed on the substrate such that the crystalline orientation of the surface of the base material of the substrate is made to a (111) surface.

In accordance with a second aspect of the present invention, there is provided a film forming method including: a preparation step of preparing a substrate having a base material on a surface of which a Cu film is to be formed; a treatment step of performing a specific treatment on the substrate to allow a crystalline orientation of the surface of the base material to have a small lattice mismatch with the Cu film; and a film formation step of forming the Cu film on the surface of the base material of the substrate.

In accordance with the present invention, prior to conducting a film forming process, by performing the specific treatment on the substrate to allow the crystalline orientation of the surface of the base material, on which the Cu film is to be formed, to have a small lattice mismatch with the Cu, a film forming rate for forming a Cu film on the base material can be increased. Further, the adhesiveness between the Cu film and the base material can be improved.

Preferably, the film forming step is performed by a CVD method. However, it is also preferable that a physical vapor deposition (PVD) method such as a plating method and a sputtering method may be employed instead.

In accordance with a third aspect of the present invention, there is provided a film forming apparatus for forming a Cu film on a surface of a base material of a substrate, including: a substrate treatment unit for performing a specific treatment on the substrate to allow a crystalline orientation of the surface of the base material of the substrate to have a small lattice mismatch with the Cu film; and a Cu film forming unit for forming the Cu film on the surface of the base material of the substrate after the treatment by the substrate treatment unit is completed.

Preferably, the substrate treatment unit is a hot plate device, a laser irradiation device or a plasma treatment device. Further, preferably, the Cu film forming unit is a CVD device for forming the Cu film by a CVD method.

In accordance with a fourth aspect of the present invention, there is provided a computer program, which realizes, when executed by a computer for controlling a film forming apparatus for forming a Cu film on a surface of a base material of a substrate, a control of performing a substrate treatment on the substrate to allow a crystalline orientation of the surface of the base material of the substrate to have a small lattice mismatch with the Cu film; and forming the Cu film on the surface of the base material of the substrate after the substrate treatment.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described with reference to the accompanying drawings.

Figure 1:
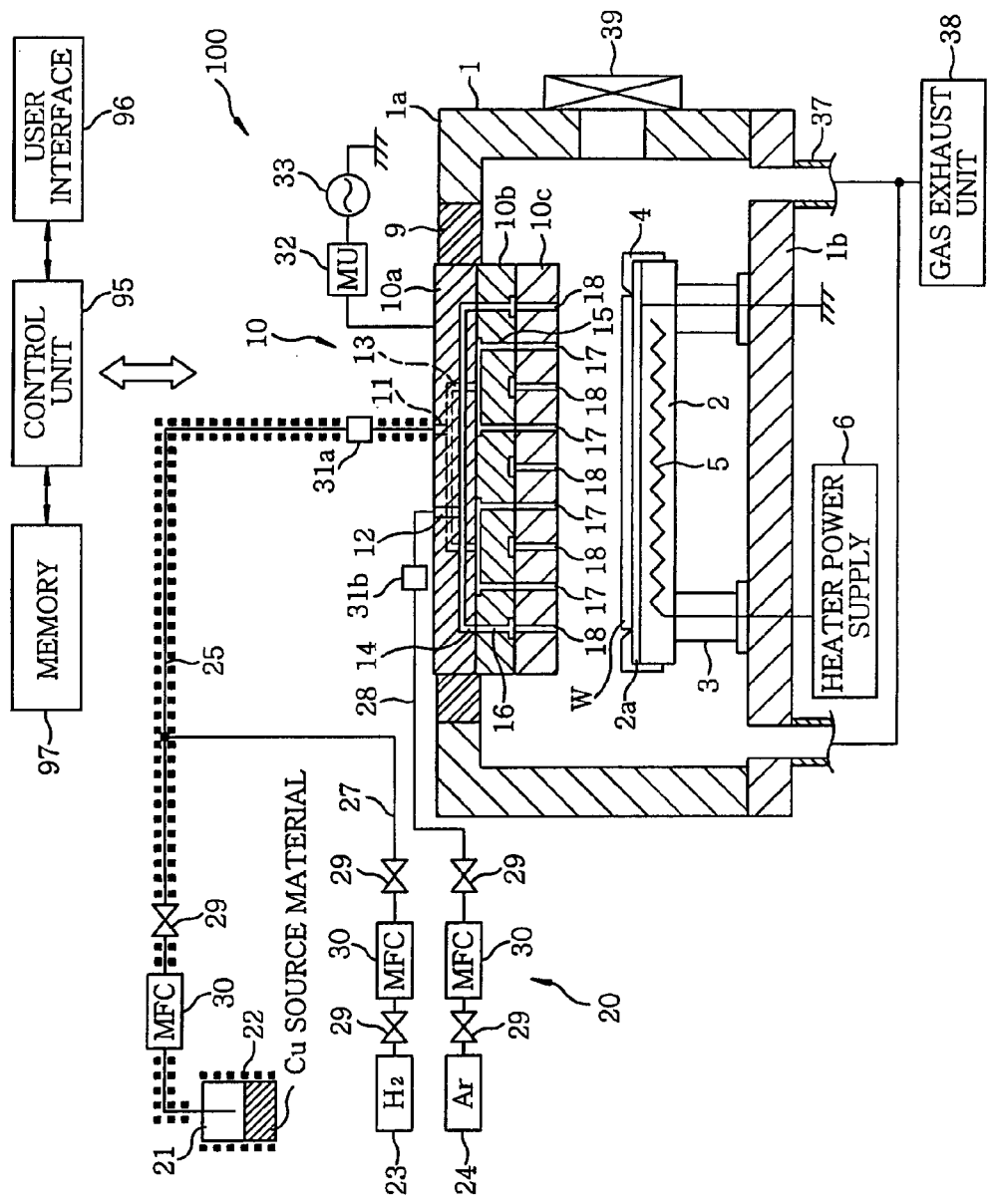
FIG. 1 is a schematic cross sectional view of a film forming apparatus for performing a film forming method in accordance with an embodiment of the present invention.

FIG. 1 is a schematic cross sectional view showing a film forming apparatus 100 for performing a film forming method (including a substrate treatment method) in accordance with an embodiment of the present invention.

As shown in FIG. 1, the film forming apparatus 100 has a substantially cylindrical chamber 1 which is hermetically sealed. A susceptor 2 for horizontally supporting thereon a wafer W to be processed is disposed in the chamber 1. The susceptor 2 is supported by a cylindrical support member 3. A guide ring 4 for guiding the wafer W is provided at an outer peripheral portion of the susceptor 2. Further, a heater 5 is embedded in the susceptor 2 and connected to a heater power supply 6. By supplying power to the heater 5 from the heater power supply 6, the wafer W is heated up to a specific temperature. Further, the susceptor 2 includes a lower electrode 2a which is grounded.

A shower head 10 is disposed at a ceiling wall 1a of the chamber 1 via an insulating member 9. The shower head 10 has an upper block body 10a, an intermediate block body 10b and a lower block body 10c.

The lower block body 10c is provided with first gas injection openings 17 and second gas injection openings 18 through which different kinds of gases are injected, the first gas injection openings 17 and the second gas injection openings being alternately arranged.

The upper block body 10a is provided with a first gas inlet opening 11 and a second gas inlet opening 12 at a top surface thereof. The first and the second gas inlet opening 11 and 12 are connected to gas lines 25 and 28, respectively. Inside the upper block body 10a, a number of gas passages 13 branch off from the first gas inlet opening 11 and a plurality of gas passages 14 branch off from the second gas inlet opening 12.

The intermediate block body 10b has gas passages 15 communicating with the gas passages 13 and also has gas passages 16 communicating with the gas passages 14. The gas passages 15 are made to communicate with the first gas injection openings 17 of the lower block body 10c, while the gas passages 16 are configured to communicate with the second gas injection openings 18 of the lower block body 10c.

The gas supply system 20 includes a Cu source material supply source 21 for supplying a Cu source material such as $Cu(TFAA)_2$, Cu(hfac)TMVS, Cu(hfac)atms, and the like; an $H_2$ gas supply source 23 for supplying $H_2$ gas as a carrier gas and a reducing gas; and an Ar gas supply source 24 for supplying Ar gas as a gas for adjusting the atmosphere in the chamber 1.

The gas line 25 is connected to the Cu source material supply source 21, and the gas line 27 which joins the gas line 25 is connected to the $H_2$ gas supply source 23. Further, the gas line 28 is connected to the Ar gas supply source 24.

On the gas line 25, a mass flow controller 30 is installed and a valve 29 is provided downstream of the mass flow controller 30. Further, a mass flow controller 30 is also installed on the gas line 27 and valves 29 are provided upstream and downstream of the mass flow controller 30 such that the mass flow controller 30 is interposed therebetween. Likewise, the gas line 28 also has a mass flow controller 30 and valves 29, wherein the valves 29 are installed upstream and downstream of the mass flow controller 30 such that the mass flow controller 30 is interposed therebetween.

The Cu source material supply source 21 and the gas line 25 connected thereto are heated by a heater 22 to be maintained at a specific temperature (e.g., no higher than about 200° C. and preferably, no higher than about 150° C.). Though a Cu source material is a solid or a liquid at a normal temperature and pressure, it is possible to supply it into the chamber 1 in a gas state by heating the Cu source material supply source 21 and the gas line 25 by means of the heater 22, while depressurizing the inside of the chamber 1, as will be described later.

The gas line 25 extended from the Cu source material supply source 21 is connected to the first gas inlet opening 11 via an insulator 31a, while the gas line 28 extended from the Ar gas supply source 24 is connected to the second gas inlet opening 12 via an insulator 31b.

In a Cu film forming process, a Cu-containing source gas supplied from the Cu source material supply source 21 is carried by $H_2$ gas supplied from the $H_2$ gas supply source 23 via the gas line 27, and is introduced into the shower head 10 through the first gas inlet opening 11 of the shower head 10, to be injected into the chamber 1 through the first gas injection openings 17 via the gas passages 13 and 15. Further, in FIG. 1, though the $H_2$ gas serving as the carrier gas and the reducing gas is supplied from the gas line 27 connected to the gas line 25, it is also possible to install a carrier gas line inside the Cu source material supply source 21 and to supply the $H_2$ gas via the carrier gas line.

Meanwhile, the Ar gas supplied from the Ar gas supply source 24 is introduced into the shower head 10 through the second gas inlet opening 12 of the shower head 10 via the gas line 28, to be injected into the chamber 1 through the second gas injection openings 18 via the gas passages 14 and 16.

A high frequency power supply 33 is connected to the shower head 10 via a matching unit (MU) 32. The high frequency power supply 33 supplies a high frequency power between the shower head 10 and the lower electrode 2a, whereby the $H_2$ gas supplied into the chamber 1 through the shower head 10 is converted into a plasma. Meanwhile, as will be described later, the plasma generation is not always necessary in the Cu film forming process.

Further, a gas exhaust line 37 is connected to a bottom wall 1b of the chamber 1, and a gas exhaust unit 38 is connected to the gas exhaust line 37. By operating the gas exhaust unit 38, the inside of the chamber 1 can be depressurized to a specific vacuum level.

Further, a gate valve 39 is provided at a sidewall of the chamber 1. While the gate valve 39 is open, a wafer W is loaded or unloaded between the chamber 1 and the outside thereof.

Each component of the film forming apparatus 100 is connected to and controlled by a control unit (process controller) 95. The control unit 95 includes a user interface 96 having a keyboard for a process manager to input a command to operate (each component of) the film forming apparatus 100, a display for showing an operational status of (each component of) the film forming apparatus 100, and the like; and a memory 97 for storing therein, e.g., control programs (e.g., programs for allowing each component of the film forming apparatus 100 to execute processes according to processing conditions) and recipes including processing condition data and the like to be used in realizing various processes, which are performed in the film forming apparatus 100 under the control of the control unit 95. When a command is received from, e.g., the user interface 96, a necessary recipe is retrieved from the memory 97 and executed by the control unit 95. As a result, a desired process is performed in the film forming apparatus 100 under the control of the control unit 95.

The recipes may be stored in a portable storage medium such as a CD-ROM or a DVD-ROM as well as being stored in a hard disk, a semiconductor memory, or the like. (Here, it is preferable that these storage mediums are set up in a specific location of the memory 97 to be read when necessary.)

Hereinafter, the film forming method for forming a Cu film on a wafer W, which is performed by the film forming apparatus 100 configured as described above, will be explained.

Figure 2:
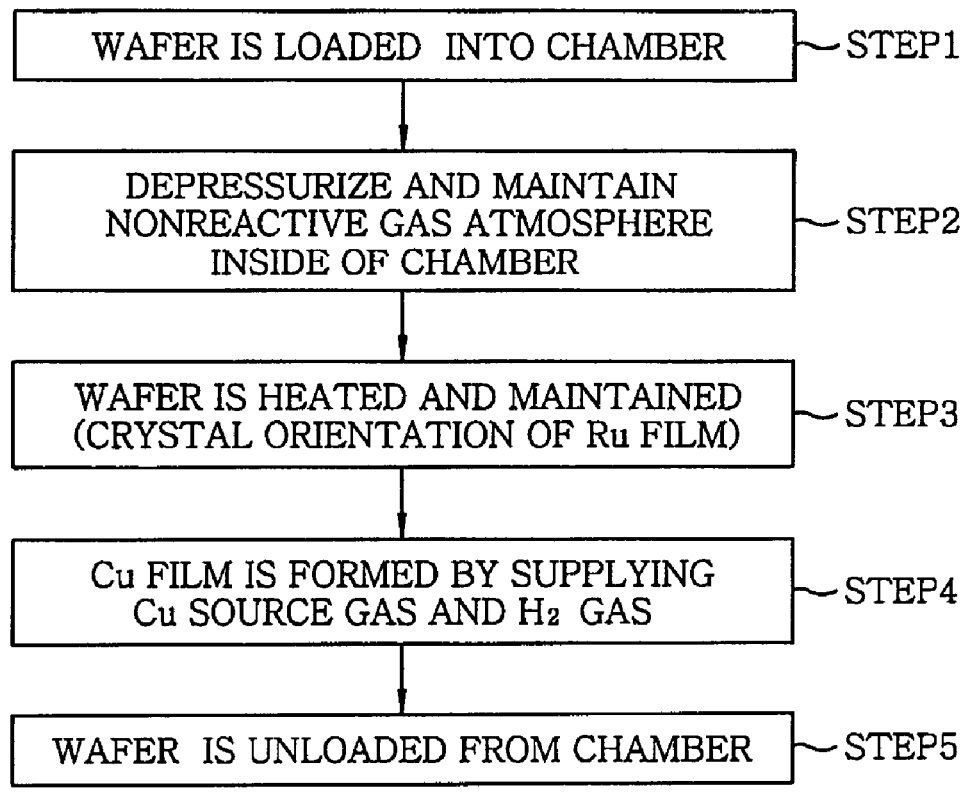
FIG. 2 sets forth a flowchart of a Cu film forming method.

FIG. 2 provides a flowchart to describe a Cu film forming method in accordance with an embodiment of the present invention. As shown in FIG. 2, the gate valve 39 is opened first, and a wafer W is loaded into the chamber 1 and mounted on the susceptor 2 (STEP1).

Here, it is assumed that a barrier film such as a Ta film or a TaN film is previously formed on the surface of the wafer W. Further, it is also assumed that a thin Ru film is previously formed on the surface of the barrier film to enhance the adhesiveness between the barrier film and a Cu film to be formed thereon. The thin Ru film can be formed by, e.g., a PVD method such as sputtering.

Subsequently, the gate valve 39 is closed, and by evacuating the chamber 1 by means of the gas exhaust unit 38 while supplying Ar gas into the chamber 1 from the Ar gas supply source 24, the inside of the chamber 1 can be maintained at, e.g., 1.33 to 2660 Pa (STEP2).

Thereafter, the temperature of the wafer W is maintained at 100 to 500° C. by the heater 5 for 10 to 1800 seconds (STEP3). This STEP3 is a process for improving the crystalline property of the Ru film by annealing the Ru film formed on the wafer W.

Figure 3:
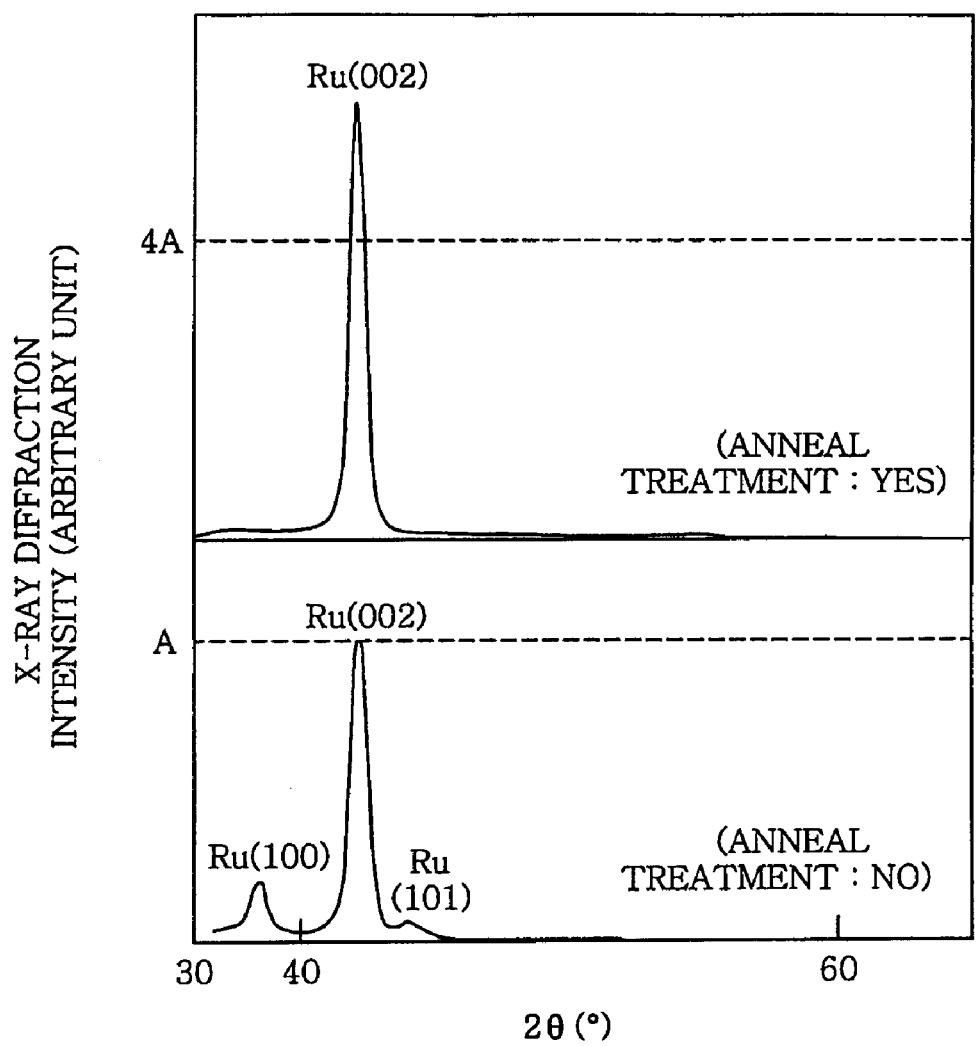
FIG. 3 provides a diagram showing X-ray diffraction intensities of a Ru film which has been subjected to an annealing treatment and a Ru film which has not.

Here, as for the case of performing the annealing treatment on the Ru film at 300° C. for 30 minutes in STEP3, FIG. 3 shows a variation (diffraction image) of an X-ray diffraction intensity of each of a (100) surface, a (002) surface and a (101) surface of the Ru film before and after performing the annealing treatment. In FIG. 3, the diffraction intensity of the Ru film which is not subjected to the annealing treatment (lower-side graph) is shown in a magnitude (scale) four times greater than that of the Ru film which has been subjected to the annealing treatment (upper-side graph).

Further, Table 1 provides an X-ray diffraction intensity ratio (i.e., an area ratio of diffraction peaks shown in FIG. 3) between the (100) surface and the (002) surface as well as an X-ray diffraction intensity ratio of the (101) surface and the (002) surface of the Ru film before and after performing the annealing treatment of STEP3. Further, for comparison, Table 1 also shows X-ray diffraction intensity ratios between the (100) surface and the (002) surface and between the (001) and the (002) surface for the case of using Ru powder.

TABLE 1

| | Annealing Treatment | X-ray diffraction intensity ratio (100)/(002) | (101)/(002) |
|---|---|---|---|
| Ru film | Yes (after) | 0 | 0 |
| Ru film | No (before) | 0.024 | 0.063 |
| Ru powder | No (before) | 1.143 | 2.857 |

The X-ray diffraction intensity for the Ru powders is found to exhibit no orientation because of polycrystallinity of the Ru powders. In such a state, the diffraction intensities of the (100) surface and the (101) surface are greater than the diffraction intensity of the (002) surface (i.e., the ratio values in Table 1 are larger than 1), as shown in Table 1. In contrast, as for the Ru film formed on the wafer W, the diffraction intensity of the (002) surface is much greater than the diffraction intensities of the (100) and the (101) surface (i.e., the ratio valves in Table 1 are smaller than 1), depending on the state of the crystalline surface of a barrier layer (in this example, a Ta film, a TaN film or the like) under the Ru film, as indicated in Table 1 and FIG. 3. Further, as for the Ru film formed on the wafer W, diffraction peaks of the (100) and the (101) surface are substantially removed by the annealing treatment, so that the surface of the Ru film is primarily oriented to the (002) surface.

Now, referring back to the flowchart of FIG. 2, after the annealing treatment for the Ru film, the temperature of the wafer W and the inner pressure of the chamber 1 are changed to specific levels as desired, respectively. Thereafter, a Cu film is formed on the annealing-treated Ru film by using, e.g., a thermal CVD method (STEP4).

More specifically, a Cu source gas supplied from the Cu source material supply source 21 is carried by $H_2$ gas supplied from the $H_2$ gas supply source 23 to be introduced and injected into the chamber 1. As a result, the Cu source material reduces on the surface of the Ru film due to the $H_2$ gas, so that Cu deposits and a Cu film is formed thereon.

Here, the above-mentioned STEP4 was performed on a Ru film which has been subjected to the annealing treatment and on a Ru film which has not. Cu(hfac)TMVS was used as the Cu source material, and other processing conditions were as follows.

Cu source gas flow rate: 274 mg/min $H_2$ gas flow rate: 150 ml/min

Chamber pressure: 66.7 Pa

Wafer temperature: 150° C.

Film forming time: 30 minutes

Figure 4:
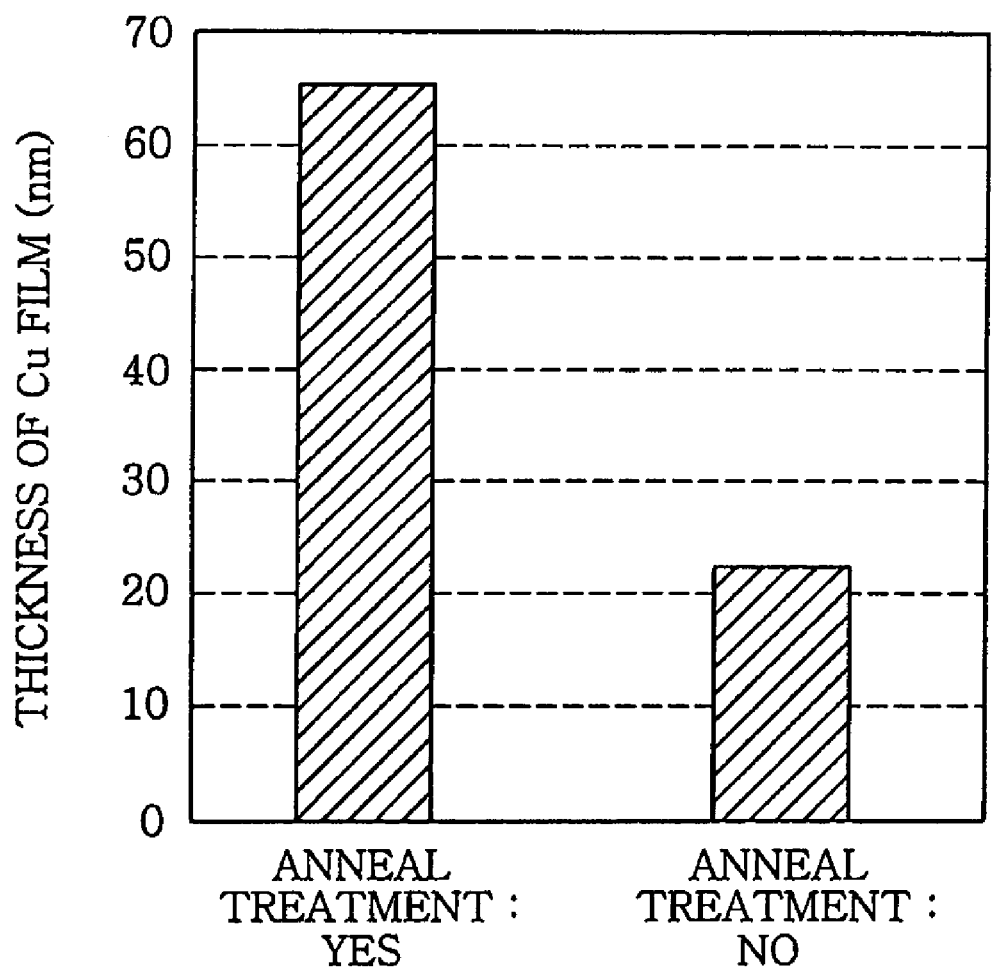
FIG. 4 presents a graph showing thicknesses of Cu films respectively formed on a Ru film which has been subjected to an annealing treatment and a Ru film which has not.

FIG. 4 shows thicknesses of Cu films formed under these conditions.

As illustrated in FIG. 4, in case of forming a Cu film on the Ru film whose orientation is enhanced by the annealing treatment of STEP3, it was possible to form a Cu film having a thickness approximately three times larger than the thickness of a Cu film formed on the Ru film which has not undergone the annealing treatment of STEP 3. That is, it is confirmed that the annealing treatment of STEP3 increases a Cu film forming rate by about three times.

As a result of measuring an X-ray diffraction intensity of the Cu film formed on the Ru film which has been subjected to the annealing treatment of STEP3, it is confirmed that the intensity of a (111) surface is extremely great. It is believed that by primarily orienting the (002) surface in the surface of the Ru film, a lattice mismatch thereof with respect to the (111) surface of Cu is reduced, resulting in a growth of the Cu film having the (111) surface.

Referring back to the flowchart of FIG. 2, after the Cu film formation is completed, the chamber 1 is evacuated while introducing Ar gas into the chamber 1, whereby residual gas in the chamber 1 is exhausted. Thereafter, the gate valve 39 is opened, and the wafer W is unloaded from the chamber 1 (STEP5). At this time, a next wafer W to be processed may be loaded into the chamber 1.

The surface of the Ru film serving to improve the film forming rate of the Cu film is not limited to the (002) surface, and may be a surface in a c-axis direction of the (001) surface or the like. This is because the (001) surface of Ru has a small lattice mismatch with the (111) surface of Cu. Further, the material for the base film on which the Cu film is to be formed is not limited to Ru, and may be any other metal film such as Al, Ag, Au, Ni, Pd, Pt, Ir, Cu, Ti, Zn, and the like. In case the base material is Ti or Zn, by primarily orienting its surface to the (001) surface or the (002) surface, a lattice mismatch thereof with the (111) surface of Cu can be reduced. Meanwhile, if the base material is one of Al, Ag, Au, Ni, Pd, Pt, Ir and Cu, by primarily orienting its surface to the (111) surface, a lattice mismatch thereof with the (111) surface of Cu film can be reduced. As a result, a Cu film forming rate can be improved.

Here, it is to be noted that the present invention is not limited to the above-described embodiment but can be modified in various ways. For example, the substrate treatment method for improving the orientation of the base material for forming the Cu film is not limited to the annealing treatment (heat treatment), but it can also be implemented by a laser irradiation treatment, a plasma treatment, or the like. Moreover, the Cu film forming method is not limited to the thermal CVD method, but an atomic layer deposition (ALD) method which is one type of a CVD method, a plasma enhanced atomic layer deposition (PEALD) method, or the like can be employed instead. Besides, the Cu film formation can be performed by a PVD method such as sputtering, an electrolysis plating method, or the like without being limited to the above-described CVD method.

Figure 5:
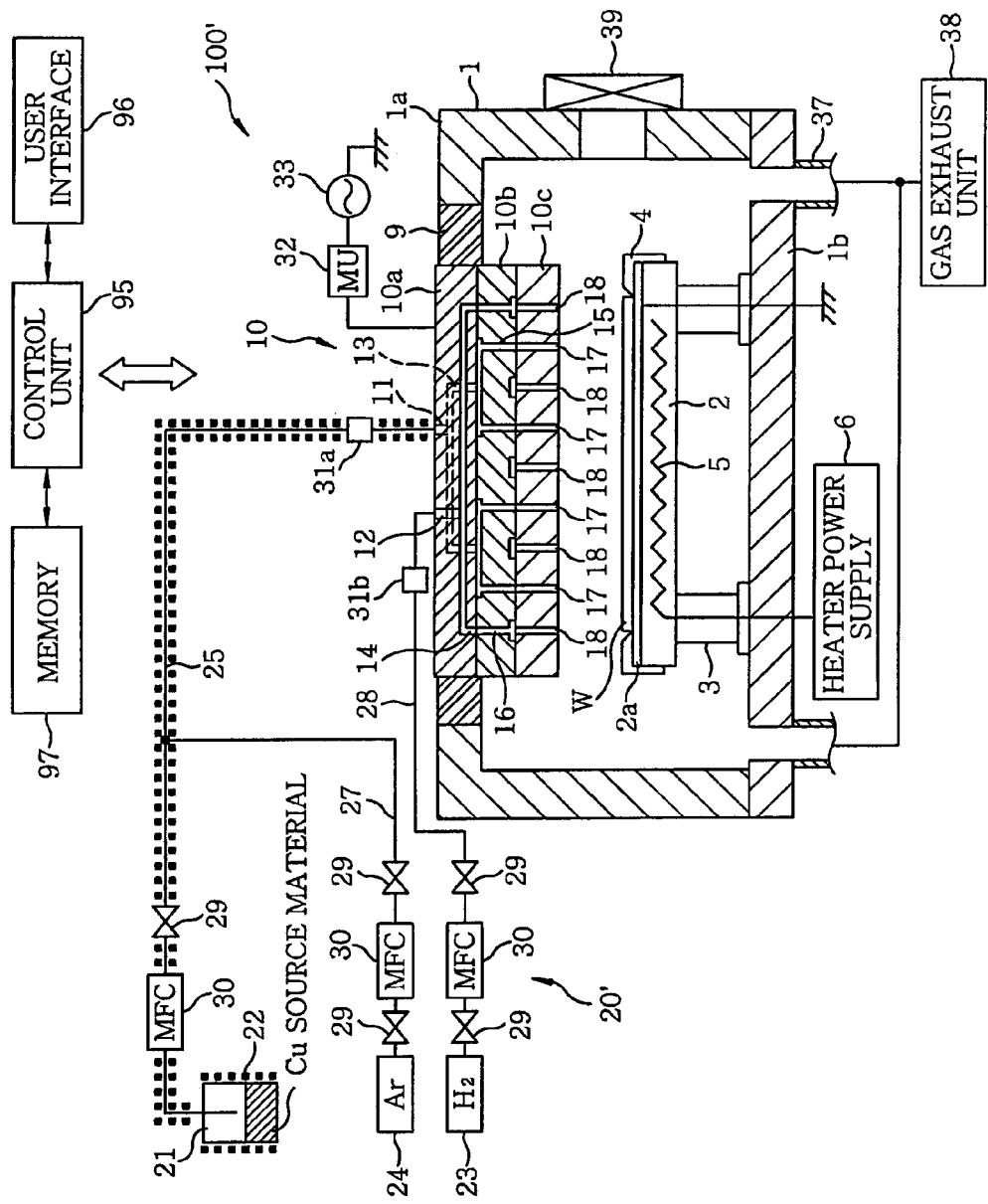
FIG. 5 illustrates a modification of the film forming apparatus shown in FIG. 1.

For example, in a Cu film formation using the ALD method, the film forming apparatus 100 is modified into a film forming apparatus 100' shown in FIG. 5, and a divalent Cu source material such as $Cu(TFAA)_2$, $Cu(dibm)_2$, $Cu(hfac)_2$, $Cu(edmdd)_2$, and the like can be used as the Cu source material. In the film forming apparatus 100', the Cu source gas is carried by Ar gas and $H_2$ gas is directly introduced into a chamber 1 via a shower head 10 (the gas supply unit 20 of the film forming apparatus 100 is modified to a gas supply unit 20').

A film forming process using the film forming apparatus 100' shown in FIG. 5 is schematically as follows. A gasified Cu source material is supplied into the chamber 1 by being carried by the Ar gas and is adsorbed on the entire surface of a wafer W which is heated up to a specific temperature. Then, the supply of the source gas is stopped and residual source gas is exhausted from the inside of the chamber 1. Subsequently, $H_2$ gas is fed into the chamber 1 and a high frequency power is supplied from a high frequency power supply 33, whereby the $H_2$ gas is converted into a plasma, generating hydrogen radicals $H_2$. By the hydrogen radicals $H_2$*, the Cu source adsorbed on the surface of the wafer W reduces, so that Cu deposits. Then, the supply of the $H_2$ gas and the high frequency power is stopped, and the $H_2$ gas is exhausted from the inside of the chamber 1. By repeating these series of processes several times, a Cu film can be formed.

Further, the film forming apparatus 100' can also perform a Cu film formation by a thermal CVD method. Also, in the film forming apparatus 100', the Ar gas may be supplied into a Cu source material supply source 21 directly. Furthermore, $NH_3$, $N_2H_4$, $NH(CH_3)_2$, $N_2H_3CH$, or the like can be used as a reducing gas without being limited to the $H_2$ gas. Moreover, a nonreactive gas such as He gas, $N_2$ gas and the like may be employed as a carrier gas instead of the Ar gas. While the present invention has been described with respect to the particular embodiments, it will be apparent to those skilled in the art that various changes and modifications may be made without departing from the scope of the invention as defined in the following claims.

What is claimed is:

1. A substrate treatment method performed on a substrate before a Cu film is formed on a surface of a base material layer of the substrate, the method comprising:
   forming a barrier film on the substrate;
   forming the base material layer on the barrier film, wherein the base material layer increases on adhesiveness between the barrier film and the Cu film; and
   performing a specific treatment on the base material layer to allow a crystalline orientation of a surface of the base material layer to have a small lattice mismatch with the Cu film,
   wherein the base material layer is made of Ru, and
   wherein the specific treatment is performed such that the crystalline orientation of the surface of the base material layer is made to a c-axis direction.

2. The substrate treatment method of claim 1, wherein the specific treatment is a heat treatment, a laser irradiation treatment or a plasma treatment.

3. The substrate treatment method of claim 1, wherein the specific treatment is performed such that the crystalline orientation of the surface of the base material layer has the small lattice mismatch with a (111) surface of the Cu film.

4. A film forming method comprising:
   preparing a substrate;
   forming a barrier film on the substrate;
   forming a base material layer on the barrier film, wherein the base material layer serves to increase an adhesiveness between the barrier film and the Cu film to be formed on the base material layer; and
   performing a specific treatment on the base material layer to allow a crystalline orientation of a surface of the base material layer to have a small lattice mismatch with the Cu film; and
   forming the Cu film on the surface of the base material layer,
   wherein the base material layer is made of Ru, and
   wherein the specific treatment is performed on the base material layer such that the crystalline orientation of the surface of the base material layer is made to a c-axis direction.

5. The film forming method of claim 4, wherein the specific treatment is a heat treatment, a laser irradiation treatment, or a plasma treatment.

6. The film forming method of claim 4, wherein the specific treatment is performed such that the crystalline orientation of the surface of the base material layer has a small lattice mismatch with a (111) surface of the Cu film.

7. The film forming method of claim 4, wherein the forming the Cu film is performed by a chemical vapor deposition (CVD) method.

* * * * *